(12) United States Patent
Tsai et al.

(10) Patent No.: US 10,439,577 B2
(45) Date of Patent: Oct. 8, 2019

(54) VARIABLE GAIN AMPLIFIER AND METHOD THEREOF

(71) Applicant: INDUSTRIAL TECHNOLOGY RESEARCH INSTITUTE, Hsinchu (TW)

(72) Inventors: Jeng-Han Tsai, Taipei (TW); Chia-Lung Lin, New Taipei (TW); Wei-Tsung Li, New Taipei (TW)

(73) Assignee: INDUSTRIAL TECHNOLOGY RESEARCH INSTITUTE, Chutung, Hsinchu (TW)

( * ) Notice: Subject to any disclaimer, the term of this patent is extended or adjusted under 35 U.S.C. 154(b) by 0 days.

(21) Appl. No.: 15/856,977

(22) Filed: Dec. 28, 2017

(65) Prior Publication Data

US 2019/0181821 A1 Jun. 13, 2019

(30) Foreign Application Priority Data

Dec. 8, 2017 (TW) .............................. 106143270 A (51) Int. Cl.
*H03G 3/00* (2006.01)
*H03G 3/30* (2006.01)
(Continued)

(52) U.S. Cl.
CPC ............. *H03G 3/3036* (2013.01); *H03F 1/56* (2013.01); *H03F 3/19* (2013.01); *H03F 2200/222* (2013.01); *H03F 2200/387* (2013.01)

(58) Field of Classification Search
CPC ........... H03G 3/3036; H03F 1/56; H03F 3/19; H03F 2200/222; H03F 2200/387
(Continued)

(56) References Cited

U.S. PATENT DOCUMENTS 6,392,487 B1   5/2002  Alexanian
7,332,967 B2   2/2008  Rogers et al.
(Continued)

FOREIGN PATENT DOCUMENTS

CN    1579046 A      2/2005
CN    202634371 U   12/2012
(Continued)

OTHER PUBLICATIONS

Ellinger et al., "Analysis and Compensation of Phase Variations Versus Gain in Amplifiers Verified by SiGe HBT Cascode RFIC," IEEE Transactions on Microwave Theory and Techniques, vol. 57, No. 8, Aug. 2009, pp. 1885-1894.
(Continued)

*Primary Examiner* — Khanh V Nguyen
*Assistant Examiner* — Khiem D Nguyen
(74) *Attorney, Agent, or Firm* — Muncy, Geissler, Olds, & Lowe, P.C.

(57) ABSTRACT

An embodiment provides a variable gain amplifying method includes: on a signal path of a radio frequency input signal, amplifying a radio frequency input signal by a plurality of serially-coupled amplifiers; steering currents from the amplifiers and controlling respective gains of the amplifiers; performing gain match on the signal path of the radio frequency input signal; and performing phase compensation on the signal path of the radio frequency input signal. The signal path of the radio frequency input signal further has first and second phase variation trends which compensate each other.

16 Claims, 4 Drawing Sheets

(51) Int. Cl.
*H03F 3/19* (2006.01)
*H03F 1/56* (2006.01)

(58) Field of Classification Search
USPC ............... 330/277, 133, 310, 302, 251, 254
See application file for complete search history.

(56) References Cited

U.S. PATENT DOCUMENTS

| | | |
|---|---|---|
| 8,085,091 B2 | 12/2011 | Abdelli et al. |
| 2010/0266066 A1 | 10/2010 | Takahashi |
| 2014/0225671 A1 | 8/2014 | Kamiyama et al. |

FOREIGN PATENT DOCUMENTS

| | | |
|---|---|---|
| CN | 203219248 U | 9/2013 |
| CN | 105577259 A | 5/2016 |
| TW | 200934104 A | 8/2009 |
| TW | M408889 U | 8/2011 |

OTHER PUBLICATIONS

Li et al., "60-GHz 5-bit Phase Shifter with Integrated VGA Phase-Error Compensation," IEEE Transactions on Microwave Theory and Techniques, vol. 61, No. 3, Mar. 2013, pp. 1224-1235.

Siao et al., "A 60 GHz Low Phase Variation Variable Gain Amplifier in 65 nm CMOS," IEEE Microwave and Wireless Components Letters, vol. 24, No. 7, Jul. 2014, pp. 457-459.

Min et al., "Single-Ended and Differential Ka-Bank BiCMOS Phased Array Front-Ends," IEEE Journal of Solid State Circuits, vol. 43, No. 10, Oct. 2008, pp. 2239-2250.

Palomba et al., "Variable Gain Amplifier Architecture with Constant Matching and Insertion Phase," Proceedings of the $43^{rd}$ European Microwave Conference, Oct. 7-10, 2013., pp. 1503-1506.

Min et al., "Ka-Bank SiGE HBT Low Phase Imbalance Differential 3-Bit Variable Gain LNA," IEEE Microwave and Wireless Components Letters, vol. 18, No. 4, Apr. 2008, pp. 272-274.

Tsai et al., "A Compact Low DC Consumption 24-GHz Cascode HEMT VGA," IEEE Microwave Conference, 2009, pp. 1625-1627.

Hsieh et al., "A 60 GHz Broadband Low-Noise Amplifier with Variable-Gain Control in 65 nm CMOS," IEEE Microwave and Wireless Components Letters, vol. 21, No. 11, Nov. 2011, pp. 610-612.

Hsieh et al., "A 57-64 GHz Low-phase-variation Variable-gain Amplifier," Microwave Symposium Digest (MTT), 2012 IEEE MTT-S International, 3 pages.

Byeon et al., "A 60 GHz Variable Gain Amplifier with a Low Phase Imbalance in 0.18 μm SiGe BiCMOS Technology," Compound Semiconductor Integrated Circuit Symposium (CSICS), 2012 IEEE, 4 pages.

Tsai et al., "A V-Bank Variable Gain Amplifier with Low Phase Variation Using 90-nm CMOS Technology," Microwave and Optical Technology Letters, vol. 56, No. 8, Aug. 2014, pp. 1946-1949.

Yeh et al., "A Wide Gain Control Range V-Bank CMOS Variable-Gain Amplifier with Built-In Linearizer," IEEE Transactions on Microwave Theory and Techniques, vol. 61, No. 2, Feb. 2013, pp. 902-913.

Huang et al., "A 60-GHz 360° 5-Bit Phase Shifter with Constant IL Compensation Followed by a Normal Amplifier with ±1 dB Gain Variation and 0.6-dBm OP_1dB," IEEE Transactions on Circuits and Systems—II: Express Briefs, vol. 64, No. 12, Dec. 2017, pp. 1437-1441.

VARIABLE GAIN AMPLIFIER AND METHOD THEREOF

CROSS-REFERENCE TO RELATED ART

This application claims the benefit of Taiwan application Serial No. 106143270, filed Dec. 8, 2017, the disclosure of which is incorporated by reference herein in its entirety.

TECHNICAL FIELD

The disclosure relates in general to a variable gain amplifier and a method thereof.

BACKGROUND

Variable gain amplifiers may amplify the radio signals to be transmitted or the received radio signals to the desired power level, and then transmit the received radio signals to the backend circuit for processing. Variable gain amplifiers may be used in a lot of fields, such as remote toys, consumer mobile communication electronic devices, base station, military fields or space fields.

Variable gain amplifiers are required to have enough gain variation range. When used in phase array transceivers, the ideal variable gain amplifiers may keep the constant phase variation in the gain variation range. However, when the gain is varied, the real variable gain amplifiers do not keep the constant phase variation, and thus needs additional control mechanism. By introducing additional control, the real variable gain amplifiers may keep the constant phase variation in the gain variation range. However, this will increase control complexity.

SUMMARY

According to one embodiment, provided is a variable gain amplifier. The variable gain amplifier includes: a plurality of serially-coupled amplifiers; a plurality of current steering circuits coupled to the amplifiers, for steering currents from the amplifiers and controlling respective gains of the amplifiers; at least one conjugate match circuit coupled to at least one first amplifier of the amplifiers, the at least one conjugate match circuit being configured for performing gain match, the at least one first amplifier being coupled to at least one first current steering circuit of the current steering circuits; and at least one phase compensation circuit coupled to at least one second amplifier of the amplifiers, the at least one phase compensation circuit being configured for performing phase compensation, the at least one second amplifier being coupled to at least one second current steering circuit of the current steering circuits. The at least one first amplifier and the at least one first current steering circuit has a first phase variation trend. The at least one second amplifier, the at least one second current steering circuit and the at least one phase compensation circuit has a second phase variation trend. The first and second phase variation trends compensate each other.

According to another embodiment, provided is a variable gain amplifying method including: on a signal path of a radio frequency input signal, amplifying a radio frequency input signal by a plurality of serially-coupled amplifiers; steering currents from the amplifiers and controlling respective gains of the amplifiers; performing gain match on the signal path of the radio frequency input signal; and performing phase compensation on the signal path of the radio frequency input signal. The signal path of the radio frequency input signal further has first and second phase variation trends which compensate each other.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Figure 1:
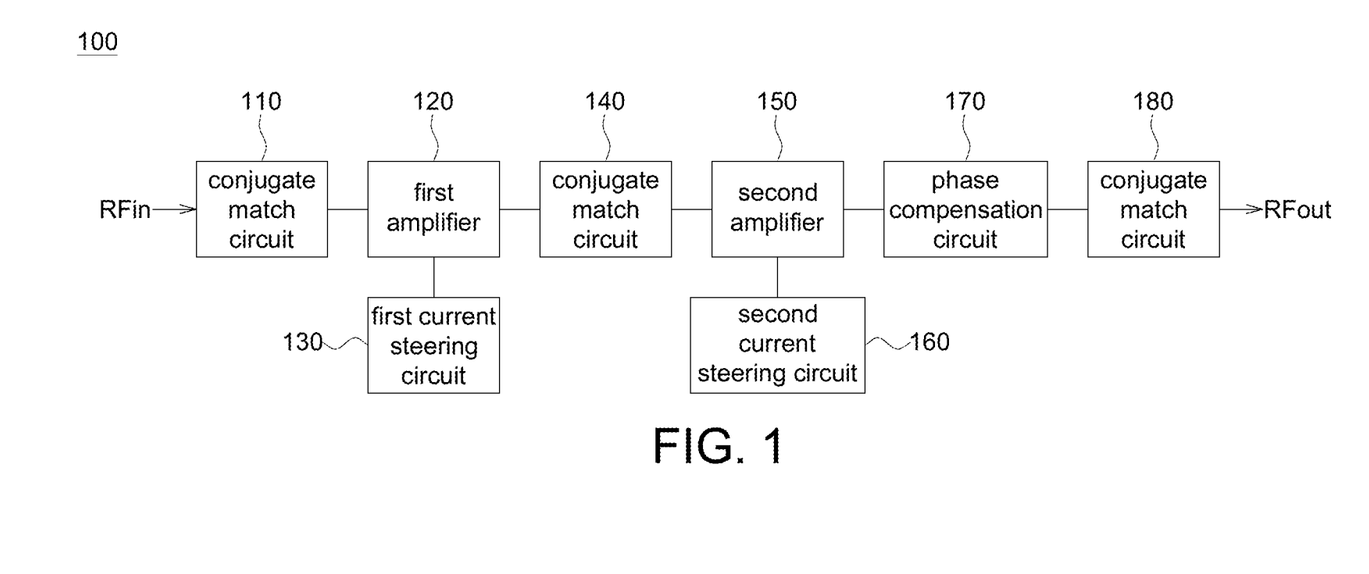
FIG. 1 shows a functional block diagram for a variable gain amplifier according to one embodiment of the application.

FIG. 1 shows a functional block diagram for a variable gain amplifier according to one embodiment of the application. As shown in FIG. 1, the variable gain amplifier 100 according to one embodiment of the application includes a conjugate match circuit 110, a first amplifier 120, a first current steering circuit 130, a conjugate match circuit 140, a second amplifier 150, a second current steering circuit 160, a phase compensation circuit 170 and a conjugate match circuit 180.

The conjugate match circuit 110 is for receiving a radio frequency input signal RFin and performs conjugate match (or gain match) on the radio frequency input signal RFin. The conjugate match circuit 110 sends the radio frequency input signal RFin to the next stage (the first amplifier 120).

The first amplifier 120 is coupled to the conjugate match circuit 110, and receives and amplifies the radio frequency input signal RFin which is processed by the conjugate match of the conjugate match circuit 110.

The first current steering circuit 130 is coupled to the first amplifier 120. The first current steering circuit 130 is configured for controlling gain of the first amplifier 120. Details of the first current steering circuit 130 are as follows.

The conjugate match circuit 140 is coupled to the first amplifier 120. The conjugate match circuit 140 is configured for performing conjugate match (or gain match) on an output signal from the first amplifier 120. The conjugate match circuit 140 sends the output signal of the conjugate match circuit 140 to the next stage (the second amplifier 150).

The second amplifier 150 is coupled to the conjugate match circuit 140, and receives and amplifies the signal which is processed by the conjugate match of the conjugate match circuit 140.

The second current steering circuit 160 is coupled to the second amplifier 150 and is configured for controlling gain of the second amplifier 150. Details of the second current steering circuit 160 are as follows.

The phase compensation circuit 170 is coupled to the second amplifier 150 and is configured for performing phase compensation on an output signal of the second amplifier 150.

The conjugate match circuit 180 is coupled to the phase compensation circuit 170 and is configured to perform conjugate match (or gain match) on an output signal from the phase compensation circuit 170 to generate a radio frequency output signal RFout.

Figure 2A:
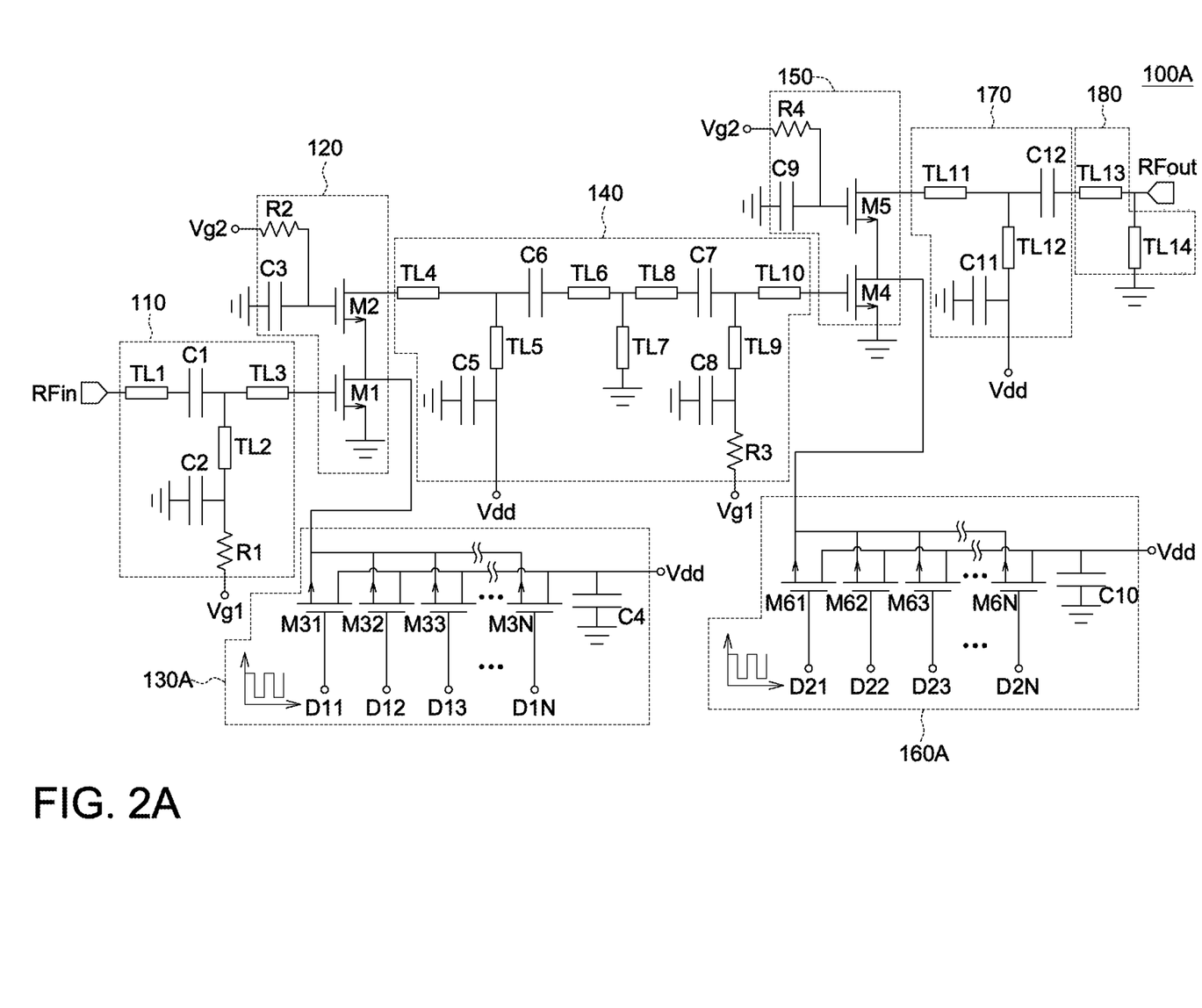
FIGS. 2A, 2B show detailed circuit diagram for a variable gain amplifier according to two embodiments of the application.

FIG. 2A shows a detailed circuit diagram for a variable gain amplifier 100A according to one embodiment of the application, wherein the first current steering circuit 130A and the second current steering circuit 160A are implemented by digital circuits.

The conjugate match circuit 110 includes transmission lines TL1-TL3, capacitors C1-C2 and a resistor R1. The transmission line TL1 includes one terminal receiving the radio frequency input signal RFin and another terminal coupled to one terminal of the capacitor C1. The capacitor C1 includes one terminal coupled to the transmission line TL1 and another terminal coupled to the transmissions TL2 and TL3. The transmission line TL2 includes one terminal coupled to the capacitor C1 and the transmission line TL3 and another terminal coupled to the capacitor C2 and the resistor R1. The transmission line TL3 includes one terminal coupled to the capacitor C1 and the transmission line TL2 and another terminal coupled to the first amplifier 120. The capacitor C2 includes one terminal coupled to the transmission line TL2 and the resistor R1 and another terminal coupled to GND. The resistor R1 includes one terminal coupled to the transmission line TL2 and the capacitor C2 and another terminal coupled to GND. Details of conjugate match (or gain match) performed by the conjugate match circuit 110 are omitted here.

The first amplifier 120 includes transistors M1-M2, a capacitor C3 and a resistor R2. The transistor M1 includes: a gate coupled to the transmission line TL3 of the conjugate match circuit 110 and for receiving the radio frequency input signal RFin processed by conjugate match (or gain match) by the conjugate match circuit 110; a source coupled to GND; and a drain coupled to a source of the transistor M2. The transistor M2 includes: a gate coupled to the capacitor C3 and the resistor R2 and for receiving a voltage source vg2 via the resistor R2; a source coupled to the drain of the transistor M1 and the first current steering circuit 130A; and a drain coupled to the conjugate match circuit 140. The capacitor C3 includes one terminal coupled to GND and another terminal coupled to the gate of the transistor M2 and the resistor R2. The capacitor C3 is a regulating capacitor for regulating the gate voltage of the transistor M2. The resistor R2 includes one terminal coupled to a voltage source vg2 and another terminal coupled to the gate of the transistor M2 and the capacitor C3. The resistor R2 is a protection element for preventing large current from damaging the transistor M2.

The first current steering circuit 130A includes a plurality of transistors M31-M3N (N being a positive integer) and a capacitor C4. The transistors M31-M3N are parallel. Gates of the transistors M31-M3N receive digital control signals D11-D1N, respectively. Sources of the transistors M31-M3N are coupled to the source of the transistor M2. Drains of the transistors M31-M3N receive the voltage source Vdd. Under control of the digital control signals D11-D1N, the transistors M31-M3N may steer current from the transistor M2 to control the gain of the first amplifier 120. The capacitor C4 includes one terminal coupled to GND and another terminal coupled to the voltage source Vdd.

The conjugate match circuit 140 includes transmission lines TL4-TL10, capacitors C5-C8 and a resistor R3. The transmission line TL4 includes one terminal coupled to the drain of the transistor M2 and another terminal coupled to the capacitor C6 and the transmission line TL5. The transmission line TL5 includes one terminal coupled to the voltage source Vdd and another terminal coupled to the transmission line TL4. The capacitor C5 includes one terminal coupled to GND and another terminal coupled to the transmission line TL5. The capacitor C6 includes one terminal coupled to the transmission lines TL4 and TL5 and another terminal coupled to the transmission line TL6. The transmission line TL6 includes one terminal coupled to the capacitor C6 and another terminal coupled to the transmission lines TL7 and TL8. The transmission line TL7 includes one terminal coupled to GND and another terminal coupled to the transmission lines TL6 and TL8. The transmission line TL8 includes one terminal coupled to the transmission lines TL6 and TL7 and another terminal coupled to the capacitor C7. The capacitor C7 includes one terminal coupled to the transmission line TL8 and another terminal coupled to the transmission lines TL9 and TL10. The transmission line TL9 includes one terminal coupled to the capacitor C7 and the transmission line TL10 and another terminal coupled to the capacitor C8 and the resistor R3. The capacitor C8 includes one terminal coupled to GND and another terminal coupled to the transmission line TL9 and the resistor R3. The resistor R3 includes one terminal coupled to GND and another terminal coupled to the transmission line TL9 and the capacitor C8. The transmission line TL10 includes one terminal coupled to the capacitor C7 and the transmission line TL9 and another terminal coupled to the second amplifier 150.

The second amplifier 150 includes transistors M4-M5, a capacitor C9 and a resistor R4. The transistor M4 includes: a gate coupled to the transmission line TL10 of the conjugate match circuit 140 and for receiving the output signal of the conjugate match circuit 140; a source coupled to GND; and a drain coupled to a source of the transistor M5. The transistor M5 includes: a gate coupled to the capacitor C9 and the resistor R4 and for receiving the voltage source vg2 via the resistor R4; a source coupled to the drain of the transistor M4 and the second current steering circuit 160A; and a drain coupled to the phase compensation circuit 170. The capacitor C9 includes one terminal coupled to GND and another terminal coupled to the gate of the transistor M5 and the resistor R4. The capacitor C9 is a regulating capacitor for regulating the gate voltage of the transistor M5. The resistor R4 includes one terminal coupled to the voltage source vg2 and another terminal coupled to the gate of the transistor M5 and the capacitor C9. The resistor R4 is a protection element for preventing large current from damaging the transistor M5.

The second current steering circuit 160A includes a plurality of transistors M61-M6N and a capacitor C10. The transistors M61-M6N are parallel. Gates of the transistors M61-M6N receive digital control signals D21-D2N, respectively. Sources of the transistors M61-M6N are coupled to the source of the transistor M5. Drains of the transistors M61-M6N receive the voltage source Vdd. Under control of the digital control signals D21-D2N, the transistors M61-M6N may steer current from the transistor M5 to control the gain of the second amplifier 150. The capacitor C10 includes one terminal coupled to GND and another terminal coupled to the voltage source Vdd.

The phase compensation circuit 170 includes transmission lines TL11-TL12 and capacitors C11-C12. The transmission line TL11 includes one terminal coupled to the drain of the transistor M5 and another terminal coupled to the capacitor C12 and the transmission line TL12. The transmission line TL12 includes one terminal coupled to the voltage source Vdd and another terminal coupled to the transmission line TL11. The capacitor C11 includes one terminal coupled to GND and another terminal coupled to the transmission line TL12. The capacitor C12 includes one terminal coupled to the transmission lines TL11 and TL12 and another terminal coupled to the conjugate match circuit 180.

The conjugate match circuit 180 includes transmission lines TL13-TL14. The transmission line TL13 includes one terminal coupled to the capacitor C12 of the phase compensation circuit 170 and another terminal for outputting the radio frequency output signal RFout. The transmission line TL14 includes one terminal coupled to GND and another terminal coupled to the transmission line TL13.

In other possible embodiment of the application, the conjugate match circuits 110 and/or 140 and/or 180 may have other circuit implementation than FIG. 2A and may be varied if needed. Also, in other possible embodiment of the application, the conjugate match circuits 110 and/or 140 and/or 180 may be optional. However, in principle, at least one conjugate match circuit is needed to perform conjugate match (gain match).

Refer to FIG. 2A for describing operations of the first current steering circuit 130A and the second current steering circuit 160A. Operations of the first current steering circuit 130A are described while the second current steering circuit 160A may have similar operations. The transistors M1 and M2 of the first amplifier 120A form an amplifier core having a function of signal amplifying path. The transistors M31-M3N are for current steering. When the digital control signals D11-D1N (logic 0 or logic 1) control ON/OFF of the transistors M31-M3N, the current flowing through the transistor M2 will be steered to the transistors M31-M3N and thus the current of the transistor M2 is reduced. Thus, the transconductance value gm2 of the transistor M2 is lowered. Thus, the digital control signals D11-D1N may adjust the current flowing through the transistor M2 and may further control the gain of the first amplifier 120 (for example, lowering the gain of the first amplifier 120). That is, if more of the transistors M31-M3M are conducted, then more current is steered from the transistor M2, and the gain of the first amplifier 120 is more lowered.

Figure 2B:
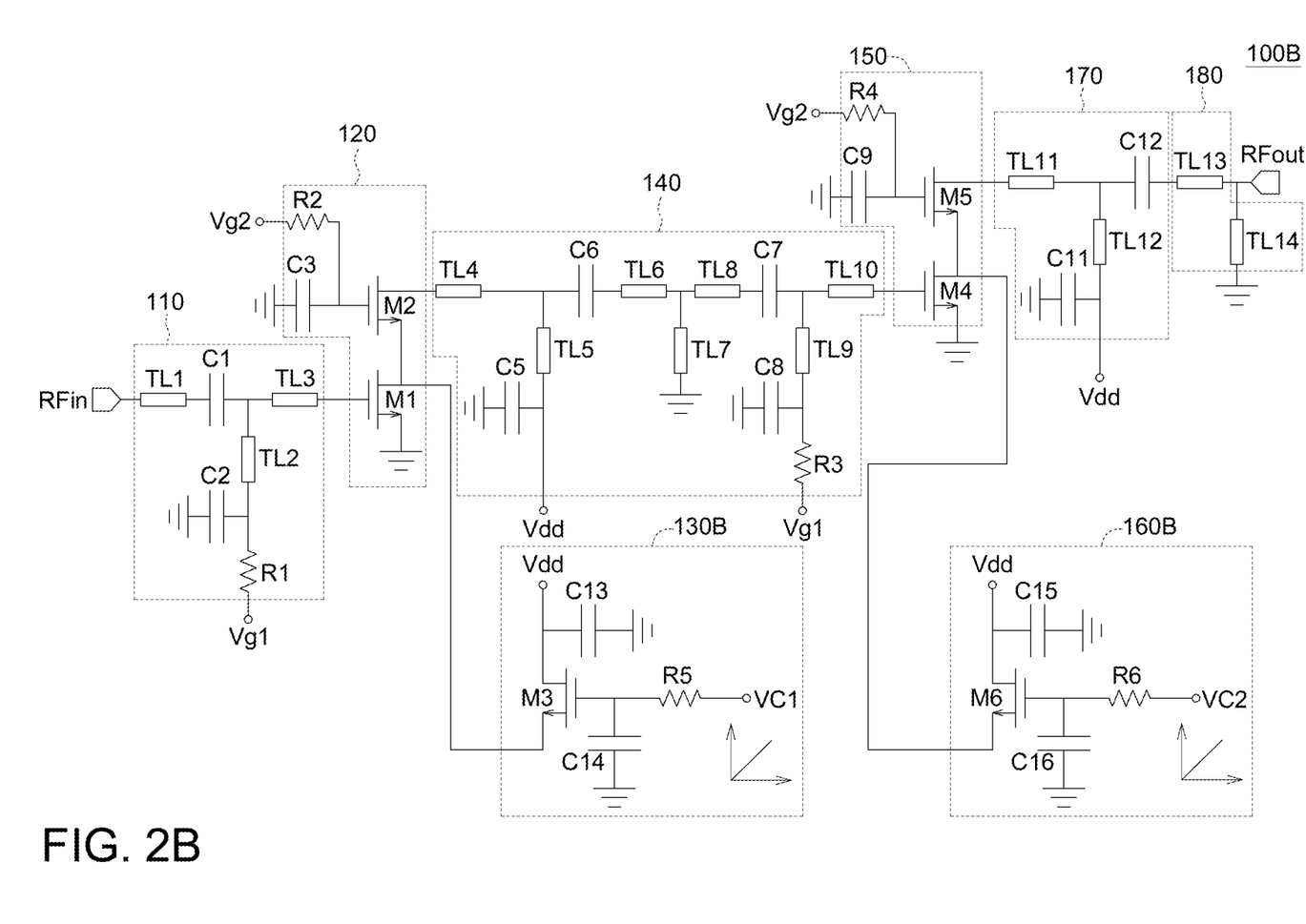

FIG. 2B shows a detailed circuit diagram for a variable gain amplifier 100B according to one embodiment of the application. The first and the second current steering circuits 130B and 160B are implemented by analog circuits.

The first current steering circuit 130B includes a transistor M3, capacitors C13-C14 and a resistor R5. The transistor M3 includes: a gate coupled to the resistor R5 and the capacitor C14 and for receiving an analog control signal VC1 via the resistor R5; a source coupled to the source of the transistor M2; and a drain receiving the voltage source Vdd. Under control of the analog control signal VC1, the transistor M3 may steer current from the transistor M2 to control the gain of the first amplifier 120. The capacitor C13 includes one terminal coupled to GND and another terminal coupled to the voltage source Vdd. The capacitor C13 is for regulating the drain voltage of the transistor M3. The capacitor C14 includes one terminal coupled to GND and another terminal coupled to the gate of the transistor M3. The capacitor C14 is for regulating the gate voltage of the transistor M3. The resistor R5 includes one terminal coupled to the voltage source Vdd and another terminal coupled to the gate of the transistor M3. The resistor R5 is a protection element for prevent large current from damaging the transistor M3.

The second current steering circuit 160B includes a transistor M6, capacitors C15-C16 and a resistor R6. The transistor M6 includes: a gate coupled to the resistor R6 and the capacitor C16 and for receiving an analog control signal VC2 via the resistor R6; a source coupled to the source of the transistor M5; and a drain receiving the voltage source Vdd. Under control of the analog control signal VC2, the transistor M6 may steer current from the transistor M5 to control the gain of the second amplifier 150. The capacitor C15 includes one terminal coupled to GND and another terminal coupled to the voltage source Vdd. The capacitor C15 is for regulating the drain voltage of the transistor M6. The capacitor C16 includes one terminal coupled to GND and another terminal coupled to the gate of the transistor M6. The capacitor C16 is for regulating the gate voltage of the transistor M6. The resistor R6 includes one terminal coupled to the voltage source Vdd and another terminal coupled to the gate of the transistor M6. The resistor R6 is a protection element for prevent large current from damaging the transistor M6.

Refer to FIG. 2B for describing operations of the first current steering circuit 130B and the second current steering circuit 160B. Operations of the first current steering circuit 130B are described while the second current steering circuit 160B may have similar operations. Similarly, the transistor M3 is for current steering. When the analog control signal VC1 controls the transistor M3 to be turned on, the current flowing through the transistor M2 will be steered to the transistor M3 and thus the current of the transistor M2 is reduced. Thus, the transconductance value gm2 of the transistor M2 is lowered and thus the gain of the first amplifier 120 is reduced. Thus, in one embodiment of the application, adjustment of the analog control signal VC1 may adjust the current flowing through the transistor M2 and may further control the gain of the first amplifier 120. That is, if the analog control signal VC1 has higher voltage level, the conductance current of the transistor M3 is higher, and thus the transistor M3 steers more current from the transistor M2. The current of the transistor M2 is smaller, and the gain of the first amplifier 120 is more lowered.

Further, in another possible embodiment of the application, the analog control signals VC1 and VC2 are continuously adjustable and thus the embodiment of the application may achieve analog gain control. The current of the transistor M1 is almost constant; and when the gain of the first amplifier 120 is varied, the input resistance is almost the same and thus good reflection loss is achieved in the embodiment of the application.

Refer to FIG. 2A and FIG. 2B again. From FIG. 2A and FIG. 2B, the total phase angle $\angle Y21$ of the first amplifier 120 and the first current steering circuit 130A/130B and the phase angles $\phi 1$, $\phi 2$ and $\phi 3$ of the transistors M1-M3 are as follows:

$$\angle Y21 = \phi1 + \phi2 + \phi3$$

$$\phi1 = -\tan^{-1}\left(\frac{\omega Cgd1}{gm1}\right)$$

$$\phi2 = \tan^{-1}\left(\frac{\omega Cds2}{gm2}\right)$$

$$\phi3 = -\tan^{-1}\left(\frac{\omega(Cds1 + Cgd1 + Cgs2 + Cds2 + Cgs3 + Cds3)}{gm2 + gm3}\right)$$

The symbols gm1, gm2 and gm3 refer to the transconductance values of the transistors M1, M2 and M3, respectively. "Cgd1" refer to the gate-drain parasitic capacitance of the transistor M1; "Cds2" refer to the drain-source parasitic capacitance of the transistor M2; "Cds1" refer to the drain-source parasitic capacitance of the transistor M1; "Cgs2" refer to the gate-source parasitic capacitance of the transistor M2; "Cds3" refer to the drain-source parasitic capacitance of the transistor M3; and "Cgs3" refer to the gate-source parasitic capacitance of the transistor M3.

When the gain is varied, the current and the transconductance value of the transistor M1 are almost kept constant. Because the phase angle φ1 is based on Cgd1 and gm1, the phase angle φ1 is also almost kept constant. Besides, the transistor M3 steers current from the transistor M2, and the transistor M3 steers current from the transistor M2, and the total current of the transistors M2 and M3 is almost kept constant (the total current of the transistors M2 and M3 flows into the transistor M1). Thus, the summation "gm2+gm3" of the transconductance values of the transistors M2 and M3 is almost kept constant. Thus, whether the total phase angle ∠Y21 is varied or not depends on the phase angle φ2. When the control signal (the analog control signal VC1 or the digital control signals D11-D1N) is higher, the current of the transistor M3 is higher but the current of the transistor M2 is lower. Thus, the transconductance value gm2 of the transistor M2 is lower. By so, the phase angle φ2 is higher. Thus, when the gain is lower, the phase variation trend is positive.

By the above equation, the parasitic capacitance of the transistors M1-M3 will affect the whole phase variation trend. In one embodiment of the application, by introducing the inductive phase compensation circuit (170) to compensate the parasitic capacitance and thus, the phase variation trend of the current steering circuit configuration is turned. In one embodiment of the application, the inductive phase compensation circuit may include a transmission line and/or an inductor.

After introducing the inductive phase compensation circuit, the phase angle term φ2 in the total phase angle ∠Y21 will become $$\tan^{-1}\left(\frac{\omega Cds2 - (1/\omega L)}{gm2}\right).$$

When "1/ωL" is higher than "ωCds2", the phase angle φ2 is negative. When the control signal (the analog control signal VC1 or the digital control signals D11-D1N) is higher, the current of the transistor M3 is higher but the current of the transistor M2 is lower. Thus, the transconductance value gm2 of the transistor M2 is lower. By so, the phase angle φ2 is decreased. Thus, when the gain is lower, the phase variation trend is negative (after introducing the inductive phase compensation circuit).

Phase compensation of the phase compensation circuit 170 is described. As shown in FIG. 2A or FIG. 2B, in one embodiment of the application, the actual length of the transmission line TL12 is shorter than 0.05 wavelength (λ); and the summation of the actual length of the transmission lines TL11 and TL12 is shorter than 0.125 wavelength (λ). 0.05 wavelength (λ) is also defined as a first length reference; and 0.125 wavelength (λ) is also defined as a second length reference. At 40 GHz frequency, the actual length of the transmission line TL12 is shorter than 200 μm (0.05λ); and the summation of the actual length of the transmission lines TL11 and TL12 is shorter than 450 μm (0.125λ). The transmission lines TL11 and TL12 which meet this length requirement may change the phase variation trend from downwards to upwards. That is, when the gain is increased, the phase variation trend is upwards. Of course, 0.05λ (the first length reference) and 0.125λ (the second length reference) are for example, not to limit the application. It is noted that the values of the first length reference and the second length reference may be changed if the manufacturing process is different, which is still within the spirit and scope of the application.

In other possible embodiment of the application, the transmission lines in the phase compensation circuit may be replaced by the inductors and the same or similar effects may be also achieved, which is still within the spirit and scope of the application.

The operation of the variable gain amplifier 100/100A/100B according to one embodiment of the application is described. Before the radio frequency input signal RFin is received by the first amplifier 120, the conjugate match circuit 110 performs conjugate match (or gain match) on the radio frequency input signal RFin and sends the radio frequency input signal RFin to the next stage (the first amplifier 120). The output signal of the conjugate match circuit 110 is amplified by the first amplifier 120. If without the first current steering circuit 130/130A/130B, the gain of the first amplifier 120 is constant. On the contrary, the first current steering circuit 130/130A/130B may control and/or adjust the gain of the first amplifier 120. After amplification by the first amplifier 120, the output signal of the first amplifier 120 is sent to the conjugate match circuit 140 which performs conjugate match (or gain match) on the output signal of the first amplifier 120 and sends the output signal of the conjugate match circuit 140 to the next stage amplifier (the second amplifier 150). The output signal of the conjugate match circuit 140 is amplified by the second amplifier 150. Similarly, if without the second current steering circuit 160/160A/160B, the gain of the second amplifier 150 is constant. On the contrary, the second current steering circuit 160/160A/160B may control and/or adjust the gain of the second amplifier 150. Besides, in one embodiment of the application, the inductive transmission lines TL11 and TL12 (or other inductive elements) which meet the length requirement may compensate the parasitic capacitance of the second amplifier 150 and the second current steering circuit 160/160A/160B, to produce different phase compensation (the phase variation trend is upwards). After phase compensation, the conjugate match circuit 180 performs conjugate match (or gain match) on the output signal of the phase compensation circuit 170 to generate the radio frequency output signal RFout.

Figure 3:
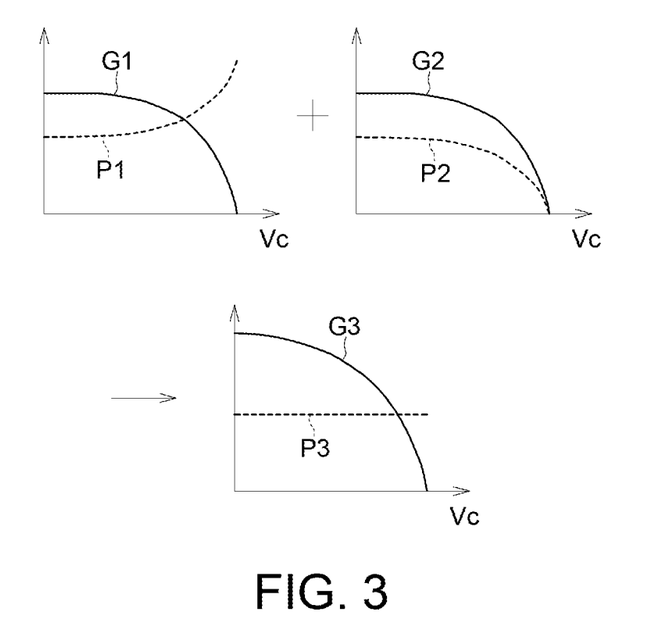
FIG. 3 shows a diagram for gain and phase variation trend according to one embodiment of the application.

FIG. 3 shows a diagram for gain and phase variation trend according to one embodiment of the application. The horizontal axis refers to the control signal Vc (which may be the analog control signals VC1-VC2 or the digital control signals D11-D1N and/or D21-D2N) input into the first current steering circuit 130 and/or the second current steering circuit 160. In FIG. 3, the curve G1 refers to the gain variation trend of the first amplifier 120 which is affected by the first current steering circuit 130; the curve P1 refers to the phase variation trend of the first amplifier 120 which is affected by the first current steering circuit 130; the curve G2 refers to the gain variation trend of the second amplifier 150 which is affected by the second current steering circuit 160; the curve P2 refers to the phase variation trend of the second amplifier 150 which is affected by the second current steering circuit 160 and the phase compensation circuit 170; the curve G3 refers to the total gain variation trend of the variable gain amplifier 100; and the curve P3 refers to the total phase variation trend of the variable gain amplifier 100.

As seen from the curves G1 and P1, as for the first amplifier 120, when the gain is lowered, the phase variation trend is upwards as described with the above equations. As seen from the curves G2 and P2, as for the second amplifier 150, when the gain is lowered, the phase variation trend is downwards because of introducing the inductive phase compensation circuit 170. Thus, as seen from the curves G3 and P3, as for the variable gain amplifier 100, when the gain of the variable gain amplifier 100 is lowered, the total phase variation trend is constant. That is, as seen from FIG. 3, the variable gain amplifier 100 according to one embodiment of the application has constant phase variation within the gain variation range. Thus, the control complexity of the whole system is lowered.

Figure 4:
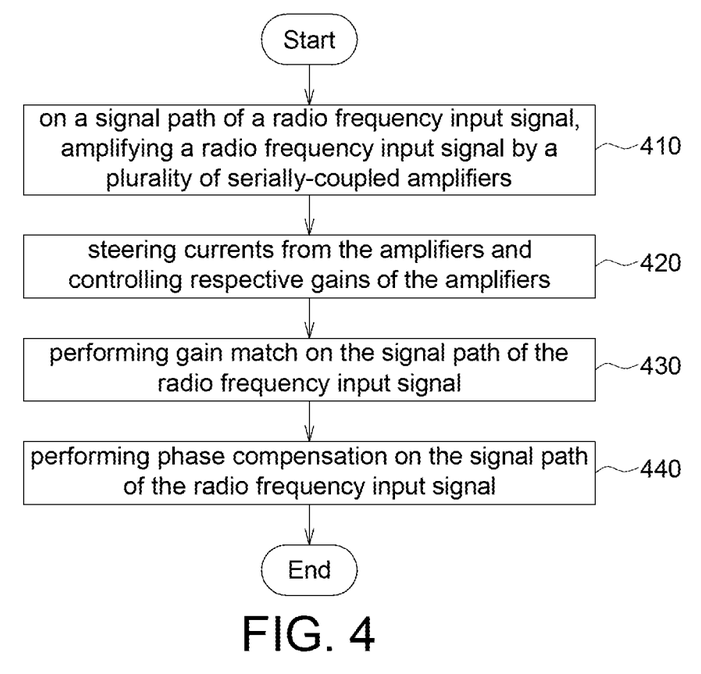
FIG. 4 shows a flow chart for a variable gain amplifying method according to one embodiment of the application.

FIG. 4 shows a flow chart for a variable gain amplifying method according to one embodiment of the application. The variable gain amplifying method includes: on a signal path of a radio frequency input signal, amplifying a radio frequency input signal by a plurality of serially-coupled amplifiers (step 410); steering currents from the amplifiers and controlling respective gains of the amplifiers (step 420); performing gain match on the signal path of the radio frequency input signal (step 430); and performing phase compensation on the signal path of the radio frequency input signal (step 440). The signal path of the radio frequency input signal further has first and second phase variation trends which compensate each other. Taking FIG. 1 as an example, the signal path of the radio frequency input signal indicates for example but not limited by, the conjugate match circuit 110, the first amplifier 120, the conjugate match circuit 140, the second amplifier 150, the phase compensation circuit 170 and the conjugate match circuit 180.

Further, in other possible embodiment of the application, the variable gain amplifier may include more amplifier stages, which is still within the spirit and scope of the application.

In other possible embodiment of the application, the variable gain amplifier includes a plurality of amplifier stages, wherein at least one amplifier stage (or even more amplifier stages) is followed by at least one phase compensation circuit, and at least one amplifier stage (or even more amplifier stages) is followed by at least one conjugate match circuit, which is still within the spirit and scope of the application.

In other possible embodiment of the application, the phase compensation circuit may be after the first amplifier or any amplifier stage, which is still within the spirit and scope of the application.

In summary, in one embodiment of the application, a variable gain amplifier having a plurality of stages and having phase compensation function is provided. At least one stage (for example but not limited by, formed by the first amplifier 120 and the first current steering circuit 130/130A/130B) having positive phase variation trend (the phase is increased in case of the control signal is higher) is serially coupled with at least one another stage (for example but not limited by, formed by the second amplifier 150, the second current steering circuit 160/160A/160B and the phase compensation circuit 170) having negative phase variation trend (the phase is decreased in case of the control signal is higher) for compensating phase with each other. By so, within the gain range, the phase variation is kept. That is, the positive phase variation trend and the negative phase variation trend may compensate each other.

By phase compensation of the phase compensation circuit 170, the variable gain amplifier of the embodiments of the application may keep the constant phase (or the phase variation is small) with the gain variation range. Further, if the variable gain amplifier of the embodiments of the application is implemented by digital control (as shown in FIG. 2A), the system control complexity is reduced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A variable gain amplifier including:
   a plurality of serially-coupled amplifiers;
   a plurality of current steering circuits coupled to the amplifiers, for steering currents from the amplifiers and controlling respective gains of the amplifiers;
   at least one conjugate match circuit coupled to at least one first amplifier of the amplifiers, the at least one conjugate match circuit being configured for performing gain match, the at least one first amplifier being coupled to at least one first current steering circuit of the current steering circuits; and
   at least one phase compensation circuit coupled to at least one second amplifier of the amplifiers, the at least one phase compensation circuit being configured for performing phase compensation by a plurality of transmission lines of the at least one phase compensation circuit, the at least one second amplifier being coupled to at least one second current steering circuit of the current steering circuits,
   wherein the at least one first amplifier and the at least one first current steering circuit has a first phase variation trend,
   the at least one second amplifier, the at least one second current steering circuit and the at least one phase compensation circuit have a second phase variation trend, and
   one of the first phase variation trend and the second phase variation trend is a positive phase variation trend; and the other one of the first phase variation trend and the second phase variation trend is a negative phase variation trend.

2. The variable gain amplifier according to claim 1, wherein the at least one phase compensation circuit includes
   a first transmission line coupled to the at least one second amplifier; and
   a second transmission line coupled to the first transmission line and a voltage source,
   the second transmission line having a length shorter than a first length reference, and
   a length summation of the first and the second transmission lines is shorter than a second length reference.

3. The variable gain amplifier according to claim 2, wherein the first length reference is 0.05 wavelength.

4. The variable gain amplifier according to claim 2, wherein the second length reference is 0.125 wavelength.

5. The variable gain amplifier according to claim 1, wherein the first phase variation trend is a positive phase variation trend and the second phase variation trend is a negative phase variation trend.

6. The variable gain amplifier according to claim 1, wherein one of the current steering circuits includes:
a transistor having a control terminal for receiving an analog control signal, a first terminal for receiving a voltage source and a second terminal coupled to one of the amplifiers, for steering currents from the amplifier and for controlling the respective gain of the amplifier.

7. The variable gain amplifier according to claim 1, wherein one of the current steering circuits includes:
a plurality of parallel transistors each including a control terminal for receiving a respective digital control signal, a first terminal for receiving a voltage source and a second terminal coupled to one of the amplifiers, for steering currents from the amplifier and for controlling the respective gain of the amplifier.

8. The variable gain amplifier according to claim 2, wherein
the at least one conjugate match circuit is coupled to the at least one phase compensation circuit and performs gain match on an output signal of the at least one phase compensation circuit.

9. A variable gain amplifying method including:
on a radio frequency input signal path, amplifying a radio frequency input signal by a plurality of serially-coupled amplifiers;
steering currents from the amplifiers and controlling respective gains of the amplifiers;
performing gain match on the radio frequency input signal path; and
performing phase compensation on the radio frequency input signal path by at least one phase compensation circuit having a plurality of transmission lines,
wherein the radio frequency input signal path further has first and second phase variation trends; one of the first phase variation trend and the second phase variation trend is a positive phase variation trend; and the other one of the first phase variation trend and the second phase variation trend is a negative phase variation trend.

10. The variable gain amplifying method according to claim 9, wherein the step of performing phase compensation on the radio frequency input signal path includes:
performing phase compensation by the at least one phase compensation circuit including a first transmission line coupled to one of the amplifiers and a second transmission line coupled to the first transmission line and a voltage source,
the second transmission line having a length shorter than a first length reference, and
a length summation of the first and the second transmission lines is shorter than a second length reference.

11. The variable gain amplifying method according to claim 10, wherein the first length reference is 0.05 wavelength.

12. The variable gain amplifying method according to claim 10, wherein the second length reference is 0.125 wavelength.

13. The variable gain amplifying method according to claim 9, wherein the first phase variation trend is a positive phase variation trend and the second phase variation trend is a negative phase variation trend.

14. The variable gain amplifying method according to claim 9, wherein the step of steering currents from the amplifiers and controlling respective gains of the amplifiers includes:
controlling a current steering operation on the amplifiers by an analog control signal, and controlling respective gains of the amplifiers.

15. The variable gain amplifying method according to claim 9, wherein the step of steering currents from the amplifiers and controlling respective gains of the amplifiers includes:
controlling a current steering operation on the amplifiers by a digital control signal, and controlling respective gains of the amplifiers.

16. The variable gain amplifying method according to claim 10, wherein
performing gain match on the radio frequency input signal path by at least one conjugate match circuit,
the at least one conjugate match circuit is coupled to the at least one phase compensation circuit and performs gain match on an output signal of the at least one phase compensation circuit.

* * * * *